United States Patent [19]

Kusters

[11] 4,215,308
[45] Jul. 29, 1980

[54] SELF CALIBRATING CRYSTAL CONTROLLED FREQUENCY COUNTER METHOD AND APPARATUS

[75] Inventor: John A. Kusters, San Jose, Calif.

[73] Assignee: Hewlett-Packard Company, Palo Alto, Calif.

[21] Appl. No.: 955,735

[22] Filed: Oct. 30, 1978

[51] Int. Cl.² ............................................. G01R 23/02
[52] U.S. Cl. ................................ 324/78 D; 324/78 Z; 324/83 D
[58] Field of Search ............... 324/78 D, 79 D, 83 D, 324/78 Z

[56] References Cited

U.S. PATENT DOCUMENTS

| | | | |
|---|---|---|---|
| 3,689,747 | 9/1972 | Milia | 324/78 Z |
| 3,990,006 | 11/1976 | Zebo | 324/78 D |
| 4,057,756 | 11/1977 | Ley | 324/83 D |

*Primary Examiner*—Michael J. Tokar
*Attorney, Agent, or Firm*—Allston L. Jones

[57] ABSTRACT

A method and apparatus for obtaining an accurate measure of the frequency of an applied signal by generating a pair of independent frequency signals wherein one of the independent frequency signals has a frequency value which is indicative of the operating temperature of the counter. The counter has two modes of operation: a calibration mode and a measurement mode. In the calibration mode, an accurate signal having a preselected frequency value is applied to the counter. The frequency of this signal is measured with reference to the other of the pair of independent frequency signals and this measured value is then algebraically combined with a prestored value that is equivalent to the preselected frequency of the applied signals. The combined value represents the necessary normalized correction factor for any measured frequency when the counter is at the corresponding temperature. The value of the one of the independent frequency signals in this mode serves as a pointer to the memory location where this correction factor is to be stored. This procedure is then repeated several times as the temperature environment of the counter varies.

In the measurement mode an unknown signal is applied to the counter, its frequency value is measured against the other of the independent frequency signals, the value of the one of the independent frequency signals is utilized as a pointer to the necessary correction factor at the then operating temperature of the counter, the measured frequency value is corrected algebraically with this correction factor, and the final result outputted for further use by the user.

14 Claims, 4 Drawing Figures

SELF CALIBRATING CRYSTAL CONTROLLED FREQUENCY COUNTER METHOD AND APPARATUS

CROSS REFERENCE

This application is related to U.S. Pat. No. 4,079,280, issued on Mar. 14, 1978, to John A. Kusters, Jerry G. Leach and Michael C. Fischer, entitled Quartz Resonator Cut To Compensate For Static And Dynamic Thermal Transients and a U.S. Pat. Application filed May 26, 1978 as Ser. No. 910,044 entitled Quartz Crystal Oscillator in the names of the same inventors as the above-named patent, both for the same assignee as this application.

BACKGROUND OF THE INVENTION

A crystal controlled frequency counter typically comprises a piezoelectric oscillator, a digital counter, an output display, and selected input, output and internal interface circuits. In these frequency counters, the piezoelectric oscillator provides the time base pulses to the digital counter to control the period during which the frequency of an applied signal is counted. The accuracy of the measured frequency result is dependent on the accuracy of the time base period which in turn is dependent on the accuracy of the piezoelectric oscillator.

Typically, the crystal resonators used in these piezoelectric oscillators are selected and processed by hand to obtain a resonator which produces a time base signal which is accurate to one part in $10^6$. These hand operations are labor intensive and include sorting, repeated lapping and polishing operations, and other fine detailing of the individual crystals to obtain the desired accuracy of the resultant time base signal.

To obtain a magnitude or better accuracy, many frequency controlled frequency counters include an oven in which the crystal is mounted. With such an oven, the ambient temperature of the crystal can be controlled within a narrow temperature range. By limiting the operational temperature range of the crystal, temperature induced frequency shifts can be greatly limited, and thus improve the frequency stability and, consequently, the accuracy of the time base signal. By using well known electronic tuning means in addition to the oven, the accuracy of the resonator frequency can be improved to one part in $10^9$ or slightly better.

It would be advantageous if an easily calibrated frequency counter using a batch processed crystal resonator were available. Such a batch processed crystal resonator can presently be manufactured having a frequency tolerance of one percent over a broad range of temperatures without the necessity of costly lapping, polishing and assorted other hand selection procedures of each crystal. It would also be advantageous if this frequency counter did not require the use of an energy intensive oven to maintain the crystal temperature within a closely held temperature range. The present invention represents such a frequency counter.

SUMMARY OF THE INVENTION

The present invention provides the capability of self calibrating a crystal controlled frequency counter without the necessity of knowing the operating temperature of the counter to compensate for temperature induced frequency shifts in the internal oscillator and without the necessity of maintaining the operating temperature of the oscillator crystal within a preselected tolerance.

In the illustrated embodiment of the invention, the crystal controlled frequency counter is calibrated by applying to the counter input a selected frequency signal having an accuracy that is at least an order of magnitude better than the desired calibration accuracy of the counter. With the counter in a selected range of temperatures, which include the range of temperatures in which the counter is to be used to measure unknown frequencies, the calibration mode is initiated.

In both the calibration mode and the measurement mode, the internal oscillator generates two independent frequency signals with one of these signals having a frequency value that is single-valued with respect to the operating temperature of the counter. The other of these signals is utilized in either mode of operation as the time base against which the selected frequency signal and the unknown frequency signal of the calibration and measurement modes, respectively, are measured. This measured frequency value is then processed to determine the necessary correction factor at the then operating temperature of the counter if it is in the calibration mode or to correct the measured value by means of a prestored normalized correction factor for the then operating temperature if in the measurement mode. In the calibration mode, the measured value of the applied selected frequency signal is algebraically combined with a prestored value that is equivalent to the selected frequency of the applied signal. In the preferred embodiment discussed below, this algebraic combination is subtraction. The resultant combined, or difference, value is representative of the necessary normalized correction factor at the then operating temperature of the counter. In the measurement mode, the previously determined and stored correction factor for the then operating factor is recalled and algebraically applied to the measured value of the unknown frequency signal to correct that measured value for temperature induced errors in its original measurement. The frequency of the one of the internally generated signals is measured and that value provides a pointer, or address, that is single-valued with respect to the temperature of the counter, to the memory location where the correction factor is stored in the measurement mode, or to be stored in the calibration mode. To complete the calibration of the counter, the above mentioned calibration steps are repeated at additional temperatures.

DESCRIPTION OF THE PREFERRED EMBODIMENT

Figure 1:
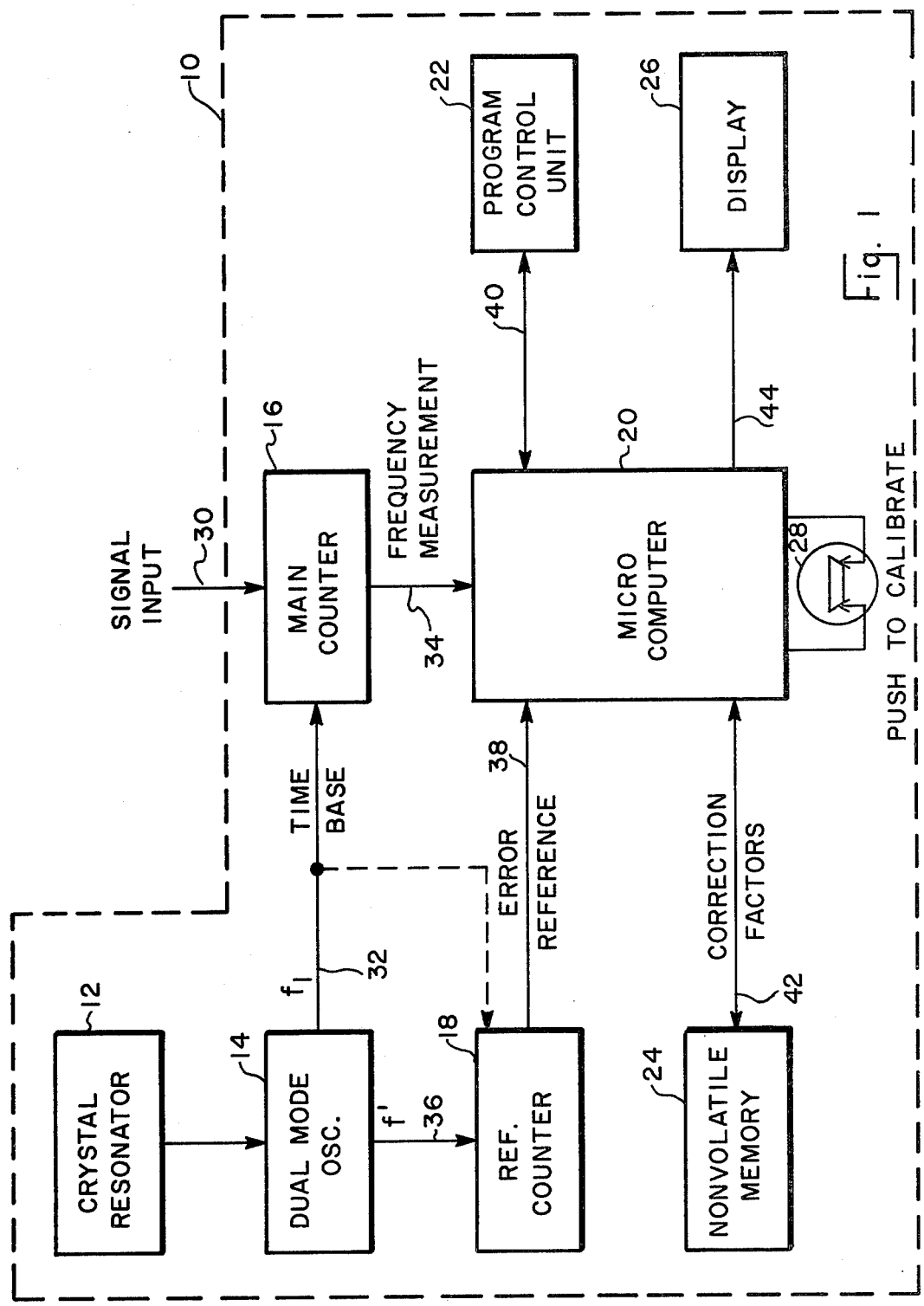
FIG. 1 is a block diagram of the self-calibrating crystal controlled frequency counter of the present invention.

With reference to FIG. 1, there is shown a self-calibrating crystal controlled frequency counter 10. Frequency counter 10 includes a crystal resonator 12, a dual mode oscillator 14, a main counter 16 (e.g. HP 5300B), a reference counter 18 (e.g. 5300B), a microcomputer 20 (e.g. Zilog Z-8), a program control unit 22 (e.g. ROM/RAM), a non-volatile memory 24 (e.g. EPROM), a display unit 26 (e.g. LCD or LED), and a push to calibrate button 28. Frequency counter 10 has two modes of operation: the frequency measurement mode and the calibration mode.

All of the necessary program steps and algorithms for each of the two modes of microcomputer 20 are stored in program control unit 22. When power is applied to the overall frequency counter 10, or after the calibration mode is terminated as discussed below, the program steps and algorithms for the frequency measurement mode are automatically transferred via line 40 from program control unit 22 to microcomputer 20. Alternately, when the operator depresses push to calibrate button 28 to initiate the calibration mode, microcomputer 20 is automatically reprogrammed with the program steps and algorithms for that mode from program control unit 22.

The frequency measurement mode is the normal mode of operation of frequency counter 10. When in this mode, an unknown frequency signal can be applied to input signal line 30 and its frequency value, measured within the calibrated accuracy of frequency counter 10, will appear on display unit 26.

To accomplish this measurement, crystal resonator 12 generates at least two different frequency signals by means of a single crystal or a pair of crystals (see FIGS. 2a and 2b and the corresponding discussion below). The signals generated by resonator 12 are then applied to the dual mode oscillator 14 where they are processed to generate a relatively temperature stable frequency signal, $f_1$. Oscillator 14 also algebraically combines the two signals from resonator 12 to form signal f', which has a frequency value that is single-valued with respect to the operating temperature of crystal resonator 12.

Signal $f_1$ is applied to the time base input of main counter 16, and the frequency of the input signal applied to input line 30 is measured with respect to that signal. The measured frequency value is then encoded into a signal which is transferred to microcomputer 20 by means of line 34. As a result of measuring the frequency of the input signal against $f_1$, which can have an inherent error resulting from temperature induced frequency variations of crystal resonator 12, there is a potential resultant error in the measured frequency of the input signal.

Signal f' is in turn applied to reference counter 18 via line 36. The frequency of f' is then measured by reference counter 18 against any time base signal with $f_1$ being the preferred time base signal. Reference counter 18 in turn generates an output signal encoded with the measured frequency value of f', and this signal is applied to microcomputer 20 via line 38. The signal being encoded with the frequency value of f' is also singled-valued with respect to the temperature of crystal resonator 12. The signal on line 38 thus lends itself to being a temperature induced error reference signal for determining the correction factor for the measured value of the input signal.

Microcomputer 20, having been programmed as discussed above, utilizes the error reference signal on line 38 (e.g., the measured value of f') as a pointer to a correction factor storage location within non-volatile memory 24. This correction factor, having been stored in a non-volatile memory 24 during a prior calibration mode (see discussion below) of frequency counter 10, represents the factor necessary to correct for errors in the measured frequency value of the unknown frequency input signal as a result of temperature induced shifts in the time base signal ($f_1$) applied to main counter 16.

If the measured frequency value of f', the error reference signal, is the same as one of the pointers or data addresses of the non-volatile memory 24, the correction factor stored in that location is transferred via line 42 to microcomputer 20. The value of f' may be between two data addresses of non-volatile memory 24. When this occurs, correction factors stored at the data addresses having values immediately above and below the f' value are transferred to microcomputer 20 where a prestored interpolation routine (designed to closely match the actual variation curve of the correction factors between the two data addresses of interest) is utilized to determine the value of the correction factor associated with this intermediate data address. The interpolation routine can be any of a number of well known routines including a linear routine or a curve fitting routine based on a crystal polynomial for temperature induced frequency changes such as $Sf = A + Bf_B + Cf_B^2 + Df_B^3 + \ldots$ wherein $f_B$ is the B mode frequency value at the operating temperature of the crystal and A, B, C, D . . . are the zeroth, first, second, third, . . . order frequency coefficients of temperature for the particular crystal being used. The frequency coefficients of temperature for the crystal are measured at the time of manufacture and preprogrammed into microcomputer 20 of program control unit 22. The algorithm to perform this interpolation being preprogrammed in microcomputer 20 directly, or in program control unit 22.

After the proper correction factor is determined, microcomputer 20, by means of a second algorithm, applies that correction factor to the value of the measured frequency to algebraically calculate an accurate measure of the unknown frequency within the desired measurement accuracy (e.g., if the correction factor is a multiplicative factor, the measured value of the frequency of the unknown signal need only be multiplied by the correction factor to obtain the correct frequency value within the calibrated accuracy of the system). A signal encoded with the corrected value of the measured frequency of the input signal is then transferred to display unit 26 via line 44. Display unit 26 then decodes the value to be displayed from the signal received on line 44 and displays this value for the instrument operator. Display unit 26 could be replaced with any one of a variety of output interface circuits (e.g., IEEE Standard 488-1975) for automatic entry of the measured value into a computer controlled test system (not shown), a printer (not shown), etc.

The second mode of operation of frequency counter 10 is the self-calibration mode. The first step in calibrating frequency counter 10 is to place the entire frequency counter in a variable temperature environment wherein the temperature will, or is programmable to, vary over at least the range of temperatures in which the instrument is to be used to measure the frequency of unknown signals. The variable temperature environment can be achieved in several ways. For example, the frequency counter can be left sitting at room temperature or placed in a programmable variable temperature oven as the temperature varies through the desired range. As will be noted below, greater calibration accuracy is achieved by lengthening the calibration period or by reducing the range of temperature variations during the calibration period.

The second step necessary to calibrate frequency counter 10 is for the operator to depress the push to calibrate button 28. Depression of button 28 causes the calibration algorithms to be read into microcomputer 20 from program control unit 22. In addition, an accurate frequency source must be connected to signal input line 30. The frequency of this source is selected to correspond to the frequency value that microcomputer 20 is programmed to receive during the calibration mode. This frequency would typically be 10 MHz, but in principle, the frequency of this source could be any frequency, even 60 Hz from the A.C. power line. The 60 cycle power line, while it has a poor short term stability, has an excellent long term stability, as a result of the daily correction of the frequency, and thus during a year, the 60 cycle frequency of the power line is extremely accurate. The type of source that might be used could be a hydrogen maser or any other source, such as a secondary standard referenced to WWV, that would have an accuracy that is at least one order of magnitude better than the desired counter accuracy.

The operation of frequency counter 10 in the calibrating mode is very similar to its operation in the frequency measurement mode. In the calibration mode, crystal resonator 12 and dual mode oscillator 14 operate as described in the frequency measurement mode above, as does reference counter 18. In this mode, main counter 16 measures the frequency of the accurate signal input utilizing $f_1$ as a time base via line 32 from dual mode oscillator 14. The measured frequency value of the accurate frequency input signal is then transferred to microcomputer 20 via line 34 as is the error reference signal from reference counter 18 via line 38. Microcomputer 20 is programmed to sample both of these inputs at discrete intervals. Since microcomputer 20 is preprogrammed to receive a signal on line 34 that is representative of the value of a selected frequency, the accurate frequency generator must have a frequency which matches this selected frequency. When the microcomputer receives the measured frequency value of the accurate frequency signal via line 34, it algebraically combines it with the programmed frequency value from the received value and generates a signal which represents the error introduced by the then operating temperature of crystal resonator 12 in the time base signal $f_1$. In the preferred embodiment, the algebraic combination of these signals consists of subtraction resulting in the generation of a normalized difference signal. This difference signal is then converted to a multiplicative correction factor that is then stored in non-volatile memory 24 via line 42 at a location to which the error reference signal received during the same sample time serves as a pointer. This calibration process continues at the preprogrammed sample rate until the operator discontinues the calibration mode by depressing the push to calibrate button 28 a second time, after a preselected number of sample points have been taken, or after a preselected time period has expired. With this method of calibrating frequency counter 10, it is unnecessary to know the specific temperature at which crystal resonator 12 is operating, since the error reference signal is representative of this temperature, and the corresponding correction factor stored at that memory location was generated simultaneously with it.

Thus, if the temperature of the environment in which frequency counter 10 is placed during the calibration mode varies very slowly, correction factors are generated for closely spaced temperature variations of crystal resonator 12. On the other hand, if the temperature variations between sampling periods are larger, the resultant correction factors will be more broadly spaced with respect to the temperature of crystal resonator 12. This situation can be improved by continuing the calibration mode over a longer period of time with the temperature range cycled through one or more times as necessary or by increasing the sample rate. The closer the spacing between the differential temperatures, the more accurately calibrated frequency counter 10 will be, and the interpolation routine mentioned above will be used less frequently, resulting in greater accuracy.

Figure 2A:
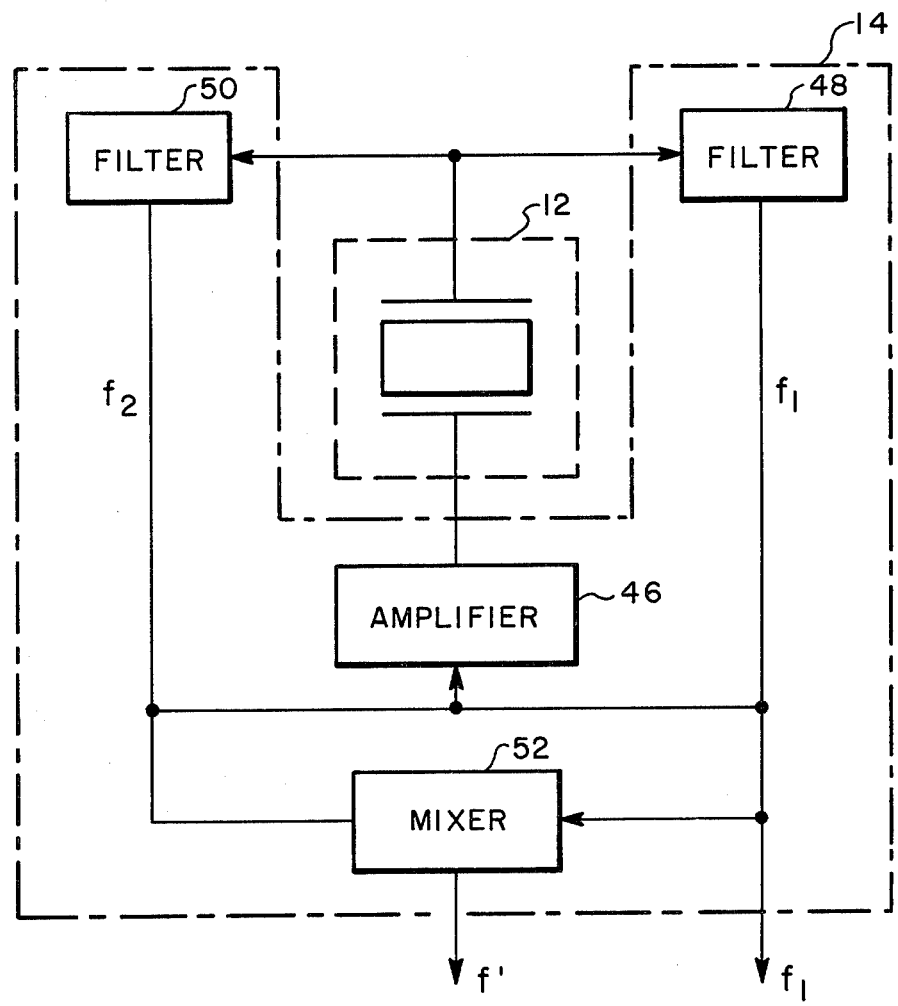
FIGS. 2a and 2b are block diagram representations of two different crystal resonator-dual mode oscillator configurations.
Figure 2B:
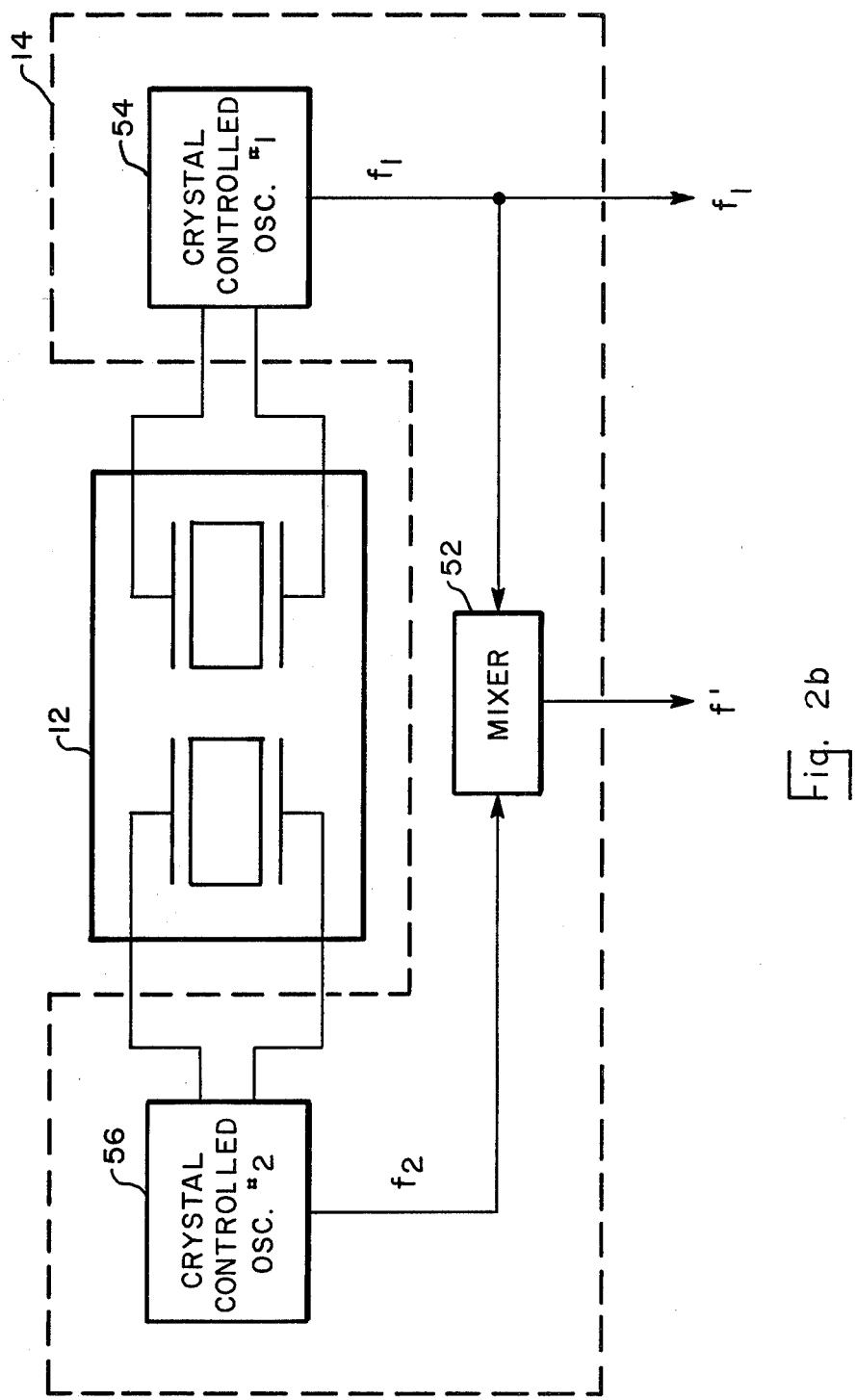

FIG. 2a and 2b show two typical crystal resonator 12 and dual mode oscillator 14 arrangements. In FIG. 2a there is shown the combination of a crystal resonator 12 having a single crystal and dual mode oscillator 14 having amplifier 46 to stimulate crystal resonator 12 into a dual frequency mode of operation, filters 48 and 50 to separate the two frequencies, one from the other, and mixer 52 to algebraically combine frequencies $f_1$ and $f_2$ to form a third frequency $f'$ which is single valued with respect to the temperature of crystal resonator 12. In FIG. 2b there is shown a crystal resonator 12 having two crystals for the generation of the two frequencies $f_1$ and $f_2$. Included within the dual mode oscillator 14 in this figure is a pair of crystal controlled oscillators 54 and 56 for exciting the individual crystals of crystal resonator 12 to produce frequencies $f_1$ and $f_2$ respectively. Also shown is a mixer 52 which is used to algebraically combine frequencies $f_1$ and $f_2$ to generate a third frequency $f'$ which is single-valued for each temperature of crystal resonator 12.

The crystal or crystals utilized by crystal resonator 12 can be of any crystalline material, such as quartz, cut in any of the known temperature compensation orientations for resonator 12 of FIG. 2b, or in any of the doubly rotated cuts (e.g., FC, IT, RT, SC, TS or TTC) for the dual mode resonator 12 of FIG. 2a. In the configuration depicted by FIG. 2b, the individual crystals are mounted in close proximity so that each crystal is operating at substantially the same temperature as the other.

Figure 3:
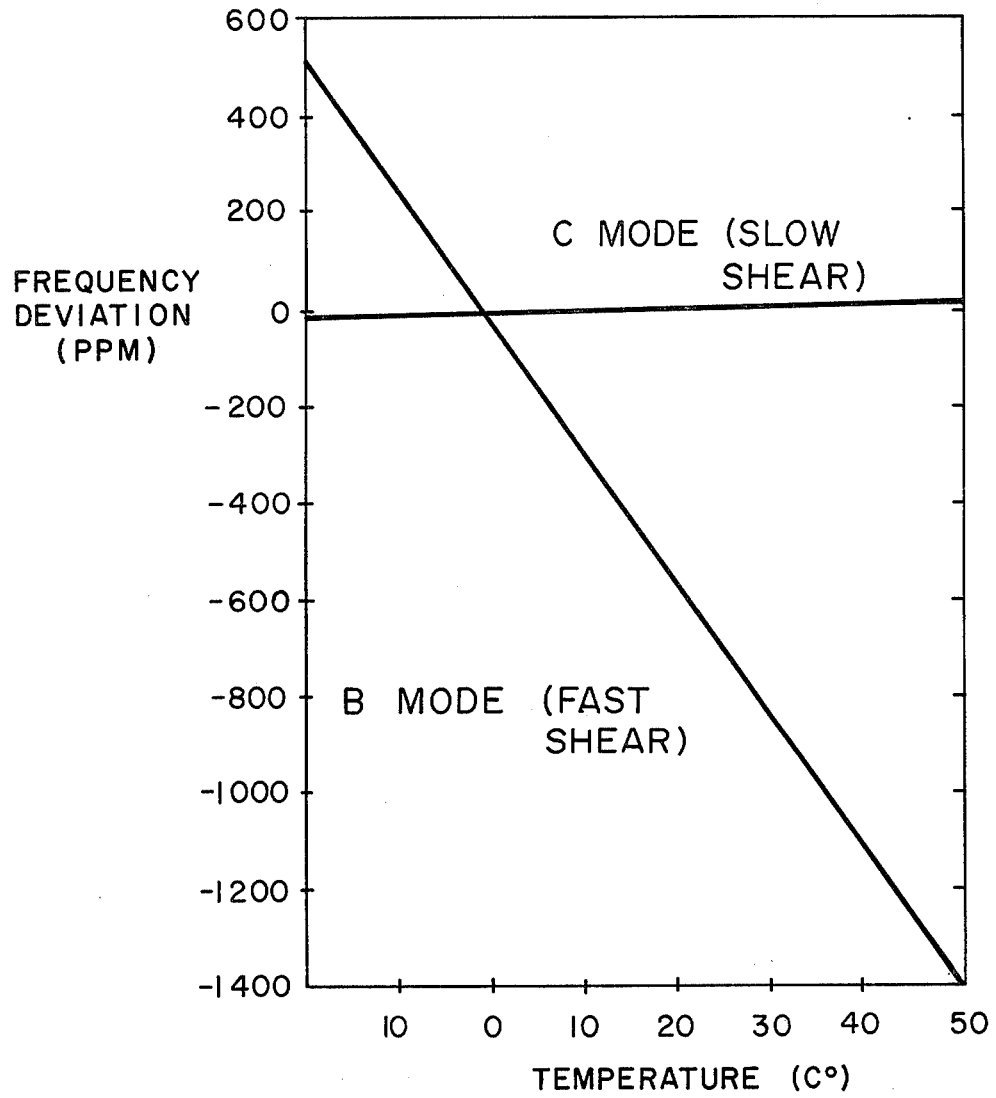
FIG. 3 is a plot of the frequency deviation versus temperature for the B and C mode frequencies of a quartz crystal of the (yxwl) 21.93°/33.93° orientation.

The preferred configuration is that of FIG. 2a wherein the resonator comprises a quartz crystal of the TTC cut which is inherently compensated for both static and dynamic temperature variations and the TTC cut orientation is substantial y equal to (yxwl) 21.93°/33.93°. Utilizing a crystal with the TTC cut and exciting the crystal into its fast shear, or B mode, and its slow shear, or C mode, the resultant deviations of the two mode frequencies versus temperature deviations are as shown in FIG. 3. These temperature-frequency deviation curves show that the B mode frequency variation is predominantly linear and the C mode frequency variation is predominantly third order over the 70° Celsius range of FIG. 3. These frequency variations are approximately 1900 PPM (parts per million) for the B mode frequency and 25 PPM for the C mode frequency.

In a crystal resonator of this type, the B mode frequency variations can be used to sense the plate temperature of the crystal and thus provide a means whereby errors caused by the temperature sensitivity of the C mode frequency can be corrected when the C mode frequency is used as a time base reference. Thus, the signal $f_1$ in FIGS. 1 and 2 could be the C mode frequency signal and $f'$ could be either $f_2$, the B mode frequency signal, or an algebraic combination of $f_1$ and $f_2$ such as the difference between $f_1$ and $f_2$, since the difference frequency signal would also be single-valued over the temperature range. The difference frequency signal is suggested as a possibility for f' since it would represent a lower frequency than $f_2$, and thus less circuitry in reference counter 18 would be necessary, resulting in a lower cost. For a more extensive discussion of the TTC crystal, see the references cited in the Cross Reference paragraph above and the references cited in each of those references.

I claim:

1. A method of calibrating a crystal controlled frequency counter, said method comprising the steps of:
   a. applying a signal having a preselected frequency to the counter;
   b. initiating a calibration mode of said counter;
   c. varying the temperature environment of said counter through a selected range of temperatures;
   d. generating and separating a first and a second frequency signal, one of said first and second frequency signals having a frequency value that is single-valued with respect to the operating temperature of the counter;
   e. measuring the frequency of the signal of step a. using one of said first and second frequency signals as a time-base signal;
   f. measuring the frequency of other of said first and second frequency signals;
   g. algebraically combining the measured frequency value of step e. and a prestored value that is equivalent to the preselected frequency value of the signal applied to the counter in step a., the calculated value being representative of a frequency correction factor for errors introduced by the crystal controlled frequency counter at the then operating temperature of the counter;
   h. calculating the correction factor from the calculated value of step g. and storing that correction factor in a memory location by the measured frequency value of step f. as a pointer thereto; and
   i. repeating steps g. and h. at selected intervals to create a set of correction factors and corresponding memory location pointers over the selected range of temperatures of step c.

2. A method of calibrating a crystal controlled frequency counter as in claim 1 wherein the preselected frequency signal of step a. is accurate to at least one order of magnitude greater than the desired measurement accuracy to which the counter is being calibrated.

3. A method of calibrating a crystal controlled frequency counter as in claim 1 wherein the selected range of temperatures of step c. includes the range of temperatures in which the counter is to be utilized after calibration is completed.

4. A method of calibrating a crystal controlled frequency counter as in claim 1 wherein the method of algebraically combining the two frequency values of step g. is the subtraction of one value from the other to generate a difference value that is representative of the frequency correction factor.

5. Frequency measurement apparatus having two operational modes, a measurement mode and a self-calibrating mode, said apparatus comprising:
   mode selection means for selecting between the two operational modes;
   crystal resonator means for generating a first and a second frequency signal;
   counter means for measuring the frequency value of of signal applied to the measurement apparatus with one of said first and second frequency signals as the time base signal, for generating a third signal having an encoded value that is representative of the measured frequency value of the applied signal, for measuring the frequency value of the other of said first and second frequency signals, and for generating a fourth signal having an encoded value that is representative of the measured frequency value of the other of said first and second frequency signals, said applied signal in the measurement mode having an unknown frequency to be measured and in the self-calibration mode having a preselected frequency value; and
   processor means for in the measurement mode correcting the encoded frequency value of said third signal for temperature induced measurement errors by utilizing the encoded frequency value of said fourth signal as a pointer to a prestored correction factor memory location for the then operating temperature of the measurement apparatus and generating a fifth signal encoded with the corrected frequency value of the applied signal, and for in the self-calibrating mode calculating the difference between the frequency value encoded in the third signal and a prestored value that was selected to be equivalent to the preselected frequency value of the signal applied to the measurement apparatus to form a correction factor and utilizing the encoded frequency value of said fourth signal as a pointer to a memory location where the calculated correction factor for the then operating temperature is to be stored.

6. Frequency measurement apparatus as in claim 5 wherein the other of said first and second frequency signals has a frequency value that is single-valued with respect to the operating temperature of the measurement apparatus.

7. Frequency measurement apparatus as in claim 5, said apparatus further including display means for decoding the corrected frequency value from the fifth signal and displaying its numerical value.

8. Frequency measurement apparatus as in claim 5 wherein the signal applied to the measurement apparatus during the calibration mode is at least one degree of magnitude more accurate than the degree of accuracy to which the measurement apparatus is to be calibrated.

9. Frequency measurement apparatus as in claim 5 wherein said processor means includes:
   microcomputer means for manipulating the encoded values of the third and fourth signals;
   program control means for storing and transferring the measurement mode and calibration mode control functions for and to the microcomputer means; and
   correction factor means for storing the correction factors determined during the calibration mode and for transferring these factors to the microcomputer means during the measurement mode.

10. Frequency measurement apparatus as in claim 9 wherein said correction factor means comprises a nonvolatile memory means for retaining the prestored correction factors when power is removed.

11. Frequency measurement apparatus as in claim 5 wherein said crystal resonator means includes a pair of crystal resonators each cut to produce a different frequency signal.

12. Frequency measurement apparatus as in claim 5 wherein said crystal resonator means includes a doubly rotated crystal capable of being excited into at least two different, independent frequency modes of vibration.

13. Frequency measurement apparatus as in claim 12 wherein said doubly rotated crystal comprises a quartz crystal having a TTC crystallographic orientation.

14. Frequency measurement apparatus as in claim 5 wherein said processor means in the measurement mode includes means for interpolating between the correction factors stored in the memory locations having addresses which represent the two closest values to the value encoded in the fourth signal when there is no prestored correction factor at the memory address corresponding to the then encoded value of the fourth signal.

* * * * *